(12) United States Patent
Washio et al.

(10) Patent No.: US 7,879,525 B2
(45) Date of Patent: Feb. 1, 2011

(54) CHEMICALLY AMPLIFIED PHOTORESIST COMPOSITION, LAMINATED PRODUCT, AND CONNECTION ELEMENT

(75) Inventors: Yasushi Washio, Kawasaki (JP); Koji Saito, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 471 days.

(21) Appl. No.: 10/547,830

(22) PCT Filed: Dec. 3, 2004

(86) PCT No.: PCT/JP2004/018032

§ 371 (c)(1), (2), (4) Date: Apr. 26, 2007

(87) PCT Pub. No.: WO2006/059392

PCT Pub. Date: Jun. 8, 2006

(65) Prior Publication Data

US 2007/0275320 A1    Nov. 29, 2007

(51) Int. Cl.
  G03F 7/00    (2006.01)
  G03F 7/004   (2006.01)
  G03F 7/42    (2006.01)

(52) U.S. Cl. .................. 430/270.1; 430/311; 430/315; 430/322; 430/331; 430/913; 430/927

(58) Field of Classification Search .............. 430/270.1, 430/311, 315, 322, 331, 913, 927
See application file for complete search history.

(56) References Cited

U.S. PATENT DOCUMENTS

| | | | | |
|---|---|---|---|---|
| 4,233,395 | A | * | 11/1980 | Klupfel et al. ............ 430/271.1 |
| 4,304,838 | A | * | 12/1981 | Hasegawa et al. ............ 430/253 |
| 4,672,100 | A | * | 6/1987 | Schonbachler et al. ........ 528/75 |
| 4,764,452 | A | | 8/1988 | Ohno |
| 5,240,817 | A | * | 8/1993 | Stout et al. .................. 430/315 |
| 5,712,080 | A | | 1/1998 | Satsu et al. |
| 5,807,913 | A | * | 9/1998 | Mikuni et al. ................ 524/131 |
| 5,942,369 | A | | 8/1999 | Ota et al. |
| 5,952,149 | A | | 9/1999 | Sakai et al. |
| 5,955,241 | A | | 9/1999 | Sato et al. |
| 5,965,640 | A | * | 10/1999 | Kobayashi et al. ............ 524/81 |
| 6,042,988 | A | | 3/2000 | Sato et al. |
| 6,245,930 | B1 | | 6/2001 | Oomori et al. |
| 6,399,275 | B1 | | 6/2002 | Sugeta et al. |
| 6,544,712 | B1 | | 4/2003 | Tachikawa et al. |
| 6,670,100 | B1 | | 12/2003 | Hasegawa et al. |
| 7,063,934 | B2 | | 6/2006 | Saito et al. |
| 2001/0033990 | A1 | | 10/2001 | Hatakeyama et al. |
| 2003/0039921 | A1 | | 2/2003 | Washio et al. |
| 2003/0064319 | A1 | | 4/2003 | Saito et al. |
| 2004/0038148 | A1 | * | 2/2004 | Ohta et al. ............... 430/270.1 |
| 2004/0121937 | A1 | | 6/2004 | Yokoi et al. |
| 2004/0237295 | A1 | | 12/2004 | Wakizaka et al. |

FOREIGN PATENT DOCUMENTS

| | | |
|---|---|---|
| JP | S59-154440 | 9/1984 |
| JP | 05-158240 | 6/1993 |
| JP | H07-235755 | 9/1995 |
| JP | 08-179508 | 7/1996 |
| JP | 08-335768 | 12/1996 |
| JP | H10-090901 | 4/1998 |
| JP | H10-274853 | 10/1998 |
| JP | 11-286535 | 10/1999 |
| JP | 2000-039709 | 2/2000 |
| JP | 2000-066386 | 3/2000 |
| JP | 2000-131843 | 5/2000 |
| JP | 2001-209179 | 8/2001 |
| JP | 2001-249451 | 9/2001 |
| JP | 2001-281863 | 10/2001 |
| JP | 2001-330962 | 11/2001 |
| JP | 2002-341537 | 11/2002 |
| JP | 2003-043688 | 2/2003 |
| JP | 2003-222993 | 8/2003 |
| JP | 2003-270801 | 9/2003 |
| JP | 2004-138758 A | 5/2004 |
| JP | 2004317584 A | 11/2004 |
| JP | 2004-347950 | 12/2004 |

OTHER PUBLICATIONS

Kucharski et al, Reactions of Tricyanuric Acid with Oxiranes.I. Synthesis of Polyetherols, Journal of Applied Polymer Science, vol. 76, 439-445 (2000).*

Office Action Issued on Jul. 22, 2008, in the Japanese Patent Application No. 2003-146231.

James W. Thackeray, George W. Orsula, Edward K. Pavoelchek, Dianne Canistro, Leonard E. Bogan, Jr., Amanda K. Berry, Karen A. Graziano; "Deep UV ANR Photoresists for 248 nm Excimer Laser Photolithography", SPIE vol. 1086 Advances in Resist Technology and Processing VI (1989); pp. 34-47.

Supplementary European Search report issued in counterpart European Patent Application No. 04821365.6, dated Jan. 18, 2010.

Extended European Search report issued in counterpart European Patent Application No. 10159910.8, dated Sep. 23, 2010.

* cited by examiner

Primary Examiner—Amanda C. Walke
(74) Attorney, Agent, or Firm—Knobbe, Martens, Olson & Bear, LLP

(57) ABSTRACT

There are provided a stable chemically amplified photoresist composition that undergoes no change in alkali solubility prior to irradiation, a photoresist laminated product produced by laminating the photoresist composition onto a support, and a manufacturing method for a photoresist pattern and a manufacturing method for a connection terminal that use the photoresist composition and the laminated product. A chemically amplified photoresist composition is provided comprising (a) a resin that undergoes a change in alkali solubility under the action of acid, (b) a compound that generates acid on irradiation, and (c) a corrosion inhibitor.

7 Claims, No Drawings

CHEMICALLY AMPLIFIED PHOTORESIST COMPOSITION, LAMINATED PRODUCT, AND CONNECTION ELEMENT

TECHNICAL FIELD

The present invention relates to a chemically amplified photoresist composition, a photoresist laminated product, a manufacturing method for a photoresist composition, a manufacturing method for a photoresist pattern, and a manufacturing method for a connection element. More specifically, the present invention relates to a chemically amplified photoresist composition, a photoresist laminated product, a manufacturing method for a photoresist composition, a manufacturing method for a photoresist pattern, and a manufacturing method for a connection element, which are ideal for use in the manufacturing of connection terminals that are used during the mounting of semiconductors or electronic components or the like onto circuit boards.

BACKGROUND ART

Photofabrication, which is now the most widely used technique for precision microprocessing, is a generic term describing the technology used for manufacturing precision components such as semiconductor packages by applying a photosensitive resin composition to the surface of a processing target to form a coating, patterning this coating using photolithography techniques, and then conducting chemical etching or electrolytic etching, and/or electroforming based mainly around electroplating, using the patterned coating as a mask.

Recently, reductions in the size of electronic equipment have lead to further developments in higher density packaging of semiconductor packages, including multipin thin-film packaging, reductions in package size, two dimensional packaging techniques using flip-chip systems, and other improvements in packaging density based on three dimensional packaging techniques. In these types of high density packaging techniques, connection terminals, including protruding electrodes (mounting terminals) such as bumps which protrude above the package, and metal posts that connect rewiring extending from peripheral terminals on the wafer with the mounting terminals, must be positioned on the surface of the substrate with very high precision.

The materials used in the above type of photofabrication are typically photoresists. Photoresists can be used, for example, in the formation of bumps or metal posts by a plating process. Bumps or metal posts can be formed, for example, by forming a photoresist layer on top of a support, exposing the photoresist layer through a predetermined mask pattern, developing the layer to form a resist pattern in which the portions for forming the bumps or metal posts have been selectively removed (stripped), embedding a conductor such as copper into the stripped portions (the resist-free portions) using plating, and then removing the surrounding residual resist pattern.

As the photoresist, the patent references 1 through 3 listed below disclose the use of photopolymerizable photosensitive resin compositions, which are used for bump formation and wiring formation.

On the other hand, chemically amplified positive photoresists comprising an acid generator are known as photosensitive resin compositions with even better sensitivity than that provided by these photopolymerizable photosensitive resin compositions. The characteristic features of a chemically amplified photoresist are that on irradiation (exposure), acid is generated from the acid generator, generation of this acid is promoted by post exposure baking, and the base resin or the like of the resin composition then undergoes an acid-catalyzed reaction, thereby altering the alkali solubility of the reacted resin.

Chemically amplified photoresists include positive photoresists, in which irradiation causes alkali insoluble portions to become alkali soluble, and negative photoresists, in which irradiation causes alkali soluble portions to become alkali insoluble. Representative examples of chemically amplified negative resists include the resists comprising a combination of polyvinylphenol and a melamine derivative, as disclosed by James W. Thackeray et al. in the non-patent reference 1 listed below.

However, when a photoresist layer is produced using the chemically amplified resists mentioned above, the metal, such as aluminum or copper, used for the substrate or support, can inhibit the action of the acid on the resin within the resist layer, making it impossible to achieve the desired high precision resist pattern characteristics.

[Patent Reference 1]
Japanese Unexamined Patent Application, First Publication No. Hei 10-207057
[Patent Reference 2]
Japanese Unexamined Patent Application, First Publication No. 2000-39709
[Patent Reference 3]
Japanese Unexamined Patent Application, First Publication No. 2000-66386
[Non-patent Reference 1]
Proceedings of SPIE, volume 1086, pp. 34 to 47 (1989)

DISCLOSURE OF INVENTION

The present invention aims to resolve the above problems associated with the conventional technology, and has an object of providing a chemically amplified photoresist composition capable of forming a high precision resist pattern, a photoresist laminated product in which such a photoresist composition is laminated on top of a support, a manufacturing method for a photoresist composition, a manufacturing method for a resist pattern, and a manufacturing method for a connection terminal.

As a result of intensive investigations, the inventors of the present invention discovered that by adding a corrosion inhibitor to a conventional chemically amplified photoresist composition, the above object could be achieved, and they were thus able to complete the present invention.

In other words, a first aspect of the present invention is a chemically amplified photoresist composition comprising (a) a resin that undergoes a change in alkali solubility under the action of acid, (b) a compound that generates acid on irradiation, and (c) a corrosion inhibitor.

A second aspect of the present invention is a photoresist laminated product comprising a support, and a photoresist layer formed from the above chemically amplified photoresist composition laminated on top of the support.

A third aspect of the present invention is a manufacturing method for a chemically amplified photoresist composition, comprising a step of mixing (a) a resin that undergoes a change in alkali solubility under the action of acid, (b) a compound that generates acid on irradiation, and (c) a corrosion inhibitor.

A fourth aspect of the present invention is manufacturing method for a photoresist pattern comprising a lamination step of laminating the aforementioned chemically amplified photoresist composition to a support to form a photoresist laminated product, an exposure step of selectively irradiating the photoresist laminated product with radiation, and a developing step of developing the laminated product following exposure to produce a photoresist pattern.

A fifth aspect of the present invention is a manufacturing method for a connection terminal comprising a step of forming a connection terminal from a conductor inside the resist-free portions of a photoresist pattern produced using the aforementioned manufacturing method for a photoresist pattern.

According to the present invention, a stable chemically amplified photoresist composition that undergoes no change in alkali solubility prior to irradiation, and a photoresist laminated product produced by laminating the photoresist composition onto a support can be obtained, and a manufacturing method for a photoresist pattern and a manufacturing method for a connection terminal that use the photoresist composition and the laminated product can also be provided.

BEST MODE FOR CARRYING OUT THE INVENTION

As follows is a detailed description of the present invention.

A chemically amplified photoresist composition of the present invention may be a positive or negative photoresist composition, provided it includes a (c) a corrosion inhibitor in addition to (a) a resin that undergoes a change in alkali solubility under the action of acid, and (b) a compound that generates acid on irradiation.

As follows is a description of an example of a negative chemically amplified photoresist composition.

(a) Resin that Undergoes a Change in Alkali Solubility Under the Action of Acid:

In those cases where the chemically amplified photoresist composition is a negative photoresist composition, the resin (a) that undergoes a change in alkali solubility under the action of acid (hereafter, referred to as the component (a)) is a resin for which the alkali solubility decreases under the action of acid. There are no particular restrictions on the component (a), which can include any of the resins typically used as the base resin within conventional negative chemically amplified photoresists, and the resin is usually selected from known resins in accordance with the light source used for exposure. Resins in which the primary component is a novolak resin provide excellent characteristics, and are consequently widely used.

Particularly preferred resins for the component (a) include resins comprising (i) a novolak resin, and (ii) at least one polymer containing a hydroxystyrene structural unit. The reason for this preference is that such resins facilitate better control of the coatability and the developing rate.

The novolak resin (i) (hereafter referred to as the component (i)) is typically obtained by an addition condensation of an aromatic compound with a phenolic hydroxyl group (hereafter, simply referred to as a phenol compound) and an aldehyde, in the presence of an acid catalyst.

Examples of the phenol compound used include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, phloroglucinol, hydroxydiphenyl, bisphenol A, gallic acid, gallic esters, α-naphthol, and β-naphthol.

Furthermore, examples of the aldehyde include formaldehyde, furfural, benzaldehyde, nitrobenzaldehyde, and acetaldehyde.

There are no particular restrictions on the catalyst used in the addition condensation, and suitable acid catalysts include hydrochloric acid, nitric acid, sulfuric acid, formic acid, oxalic acid, and acetic acid.

The weight average molecular weight of the novolak resin is typically within a range from 3,000 to 10,000, and even more preferably from 6,000 to 9,000, and most preferably from 7,000 to 8,000. If the weight average molecular weight is less than 3,000, then the film tends to be prone to thickness loss (thinning) following developing, whereas if the weight average molecular weight exceeds 10,000, then undesirable residues tend to be left following developing.

Examples of the polymer (ii) (hereafter referred to as the component (ii)) containing a hydroxystyrene structural unit include radical or ionic polymers formed solely from hydroxystyrene structural units including hydroxystyrenes such as p-hydroxystyrene, and α-alkylhydroxystyrenes such as α-methylhydroxystyrene and α-ethylhydroxystyrene, as well as copolymers formed from hydroxystyrene structural units and other, different structural units. The proportion of hydroxystyrene structural units within such copolymers is preferably at least 1% by weight, and even more preferably within a range from 10 to 30% by weight. The reason for this requirement is that if the proportion of the hydroxystyrene structural units is less than 10% by weight, then the developability and resolution tend to deteriorate.

The weight average molecular weight of the component (ii) is preferably no more than 5,000, and even more preferably within a range from 2,000 to 4,000. This is because if the weight average molecular weight exceeds 5,000, the resolution tends to deteriorate.

The structural units of the polymer (ii) may include structural units other than the hydroxystyrene structural units listed above. Preferable examples of monomers that form such structural units include monomers in which the hydroxyl group of the hydroxystyrene structural unit has been substituted with another group, and monomers containing an α,β-unsaturated double bond.

As the above other group used to substitute the hydroxyl group of the hydroxystyrene structural unit, alkali dissolution inhibiting groups that do not dissociate under the action of acid may be used.

Examples of such alkali dissolution inhibiting groups that do not dissociate under the action of acid include substituted or unsubstituted benzenesulfonyloxy groups, substituted or unsubstituted naphthalenesulfonyloxy groups, substituted or unsubstituted benzenecarbonyloxy groups, and substituted or unsubstituted naphthalenecarbonyloxy groups. Specific examples of preferred substituted or unsubstituted benzenesulfonyloxy groups include benzenesulfonyloxy groups, chlorobenzenesulfonyloxy groups, methylbenzenesulfonyloxy groups, ethylbenzenesulfonyloxy groups, propylbenzenesulfonyloxy groups, methoxybenzenesulfonyloxy groups, ethoxybenzenesulfonyloxy groups, propoxybenzenesulfonyloxy groups, and acetoaminobenzenesulfonyloxy groups. Specific examples of preferred substituted or unsubstituted naphthalenesulfonyloxy groups include naphthalenesulfonyloxy groups, chloronaphthalenesulfonyloxy groups, methylnaphthalenesulfonyloxy groups, ethylnaphthalenesulfonyloxy groups, propylnaphthalenesulfonyloxy groups, methoxynaphthalenesulfonyloxy groups, ethoxynaphthalenesulfonyloxy groups, propoxynaphthalenesulfonyloxy groups, and acetoaminonaphthalenesulfonyloxy groups. Examples of substituted or unsubstituted benzenecarbonyloxy groups, and substituted or unsubstituted naphthalenecarbonyloxy groups include the above substituted or unsubstituted sulfonyloxy groups in which the sulfonyloxy groups have been substituted with carbonyloxy groups. Of the above groups, acetoaminobenzenesulfonyloxy groups and acetoaminonaphthalenesulfonyloxy groups are particularly preferred.

Furthermore, specific examples of monomers containing an α,β-unsaturated double bond include styrene-based monomers such as styrene, chlorostyrene, chloromethylstyrene, vinyltoluene, and α-methylstyrene, acrylate monomers such as methyl acrylate, methyl methacrylate, and phenyl methacrylate, and vinyl acetate-based monomers such as vinyl acetate and vinyl benzoate, and of these monomers, styrene is preferred. Copolymers formed from a hydroxystyrene and a styrene, such as poly(4-hydroxystyrene-styrene) copolymers and poly(4-hydroxystyrene-methylstyrene) copolymers, display high resolution and excellent heat resistance and are consequently preferred.

In order to suitably control certain physical and chemical characteristics, other resins may also be added to the component (a). Examples of such resins include acrylic resins (iii) and vinyl resins (iv).

Acrylic Resins (iii):

There are no particular restrictions on the acrylic resin of the component (iii), provided it is an alkali-soluble acrylic resin, although resins comprising a structural unit derived from a polymerizable compound with an ether linkage, and a structural unit derived from a polymerizable compound containing a carboxyl group are particularly preferred.

Examples of the polymerizable compound containing an ether linkage include (meth)acrylic acid derivatives containing both an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, and tetrahydrofurfuryl (meth)acrylate, and of these, 2-methoxyethyl acrylate and methoxytriethylene glycol acrylate are preferred. These compounds can be used either alone, or in combinations of two or more different compounds.

Examples of the polymerizable compound containing a carboxyl group include monocarboxylic acids such as acrylic acid, methacrylic acid, and crotonic acid, dicarboxylic acids such as maleic acid, fumaric acid, and itaconic acid, and compounds containing both a carboxyl group and an ester linkage such as 2-methacryloyloxyethylsuccinic acid, 2-methacryloyloxyethylmaleic acid, 2-methacryloyloxyethylphthalic acid, and 2-methacryloyloxyethylhexahydrophthalic acid. Of these, acrylic acid and methacrylic acid are preferred. These compounds can be used either alone, or in combinations of two or more different compounds.

Vinyl Resins (iv):

The vinyl resin of the component (iv) is a poly(vinyl low alkyl ether), and comprises a (co)polymer produced by polymerizing either a single vinyl low alkyl ether represented by a general formula (I) shown below, or a mixture of two or more such ethers.

[Formula 1]

(wherein in the general formula (I), $R^6$ represents a straight chain or branched alkyl group of 1 to 5 carbon atoms.)

In the general formula (I), examples of the straight chain or branched alkyl group of 1 to 5 carbon atoms include a methyl group, ethyl group, n-propyl group, i-propyl group, n-butyl group, i-butyl group, n-pentyl group, and i-pentyl group. Of these alkyl groups, a methyl group, ethyl group, or i-butyl group is preferred, and a methyl group or ethyl group is particularly desirable. In the present invention, poly(vinyl methyl ether) and poly(vinyl ethyl ether) are particularly preferred examples of the poly(vinyl low alkyl ether).

In those cases where the component (a) is a mixed resin comprising a component (i) and a component (ii), if the combination of the component (i) and the component (ii) is deemed 100 parts by weight, then the component (i) typically accounts for 50 to 98 parts by weight, and preferably from 55 to 95 parts by weight, whereas the component (ii) accounts for 50 to 2 parts by weight, and preferably from 45 to 5 parts by weight.

(b) Compound that Generates Acid on Irradiation

The component (b) used in the present invention is an acid generator, and there are no particular restrictions on the compound, provided it generates acid, either directly or indirectly, on irradiation with light. Specific examples include halogen-containing triazine compounds such as 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, and tris(2,3-dibromopropyl)-1,3,5-triazine, and halogen-containing triazine compounds represented by a general formula shown below such as tris(2,3-dibromopropyl) isocyanurate.

[Formula 2]

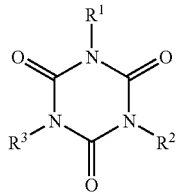

(wherein, $R^1$ to $R^3$ may be either the same or different, and each represents a halogenated alkyl group)

Other specific examples of the component (b) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, α-(ethylsulfonyloxyimino)-1-cyclopentenylacetonitrile, and compounds represented by a general formula shown below.

[Formula 3]

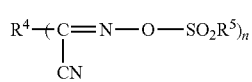

(wherein, $R^4$ represents a monovalent to trivalent organic group, $R^5$ represents a substituted or unsubstituted saturated hydrocarbon group, unsaturated hydrocarbon group, or aromatic compound group, and n represents a natural number within a range from 1 to 3). Here, the term "aromatic compound group" refers to a group formed from a compound that shows the characteristic physical and chemical properties of an aromatic compound, and specific examples include aromatic hydrocarbon groups such as a phenyl group or naphthyl group, and heterocyclic groups such as a furyl group or thienyl group. These groups may also include suitable substituents on the ring, including one or more halogen atoms, alkyl groups, alkoxy groups, or nitro groups. Furthermore, as the group $R^5$, alkyl groups of 1 to 4 carbon atoms are particularly preferred, including a methyl group, ethyl group, propyl group, and butyl group. Compounds in which $R^4$ represents an aromatic compound group, and $R^5$ represents a lower alkyl group are particularly preferred. Examples of the acid generators represented by the above general formula, in the case where n=1, include compounds in which $R^4$ is a phenyl group, a methylphenyl group or a methoxyphenyl group, and $R^5$ is a methyl group, namely, α-(methylsulfonyloxyimino)-1-phenylacetonitrile, α-(methylsulfonyloxyimino)-1-(p-methylphenyl)acetonitrile, and α-(methylsulfonyloxyimino)-1-(p-methoxyphenyl)acetonitrile. In the case where n=2, specific examples of the acid generators represented by the above general formula include the acid generators represented by the chemical formulas shown below.

[Formulas 4]

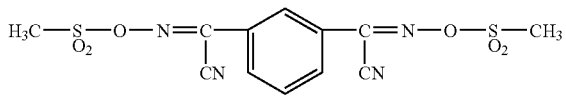

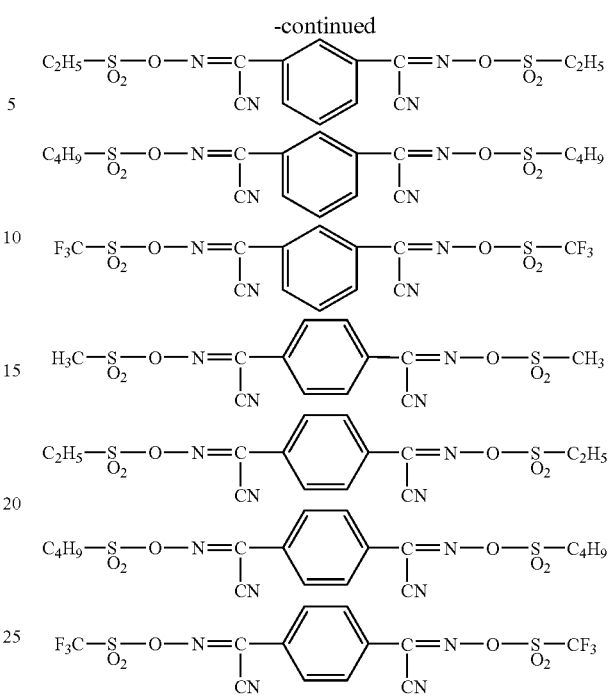

Additional specific examples of the component (b) include bissulfonyldiazomethanes such as bis(p-toluenesulfonyl)diazomethane, bis(1,1-dimethylethlsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-nitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonic acid esters such as pyrogallol trimesylate, pyrogallol tritosylate, benzyl tosylate, benzyl sulfonate, N-methylsulfonyloxysuccinimide, N-trichloromethylsulfonyloxysuccinimide, N-phenylsulfonyloxymaleimide, and N-methylsulfonyloxyphthalimide; trifluoromethanesulfonate esters such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl) iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzoin tosylates such as benzoin tosylate and α-methylbenzoin tosylate; and other diphenyliodonium salts, triphenylsulfonium salts, phenyldiazonium salts, and benzyl carbonate.

As the component (b), either one of these compounds, or a combination of two or more different compounds, can be used.

In a composition of the present invention, the quantity of the component (b) is preferably within a range from 0.1 to 20 parts by weight per 100 parts by weight of the component (a). If the quantity of the component (b) is less than 0.1 parts by weight, then there is a danger of the sensitivity becoming unsatisfactory, whereas if the quantity exceeds 20 parts by weight, then achieving a uniform resist composition becomes difficult, and there is also a danger of a deterioration in the developability. If factors such as the sensitivity, the uniformity of the resist composition, and the developability are considered, then a particularly preferred range for the quantity of the component (b) is from 5 to 15 parts by weight.

There are no particular restrictions of the corrosion inhibitor of the component (c), provided it is capable of preventing corrosion of the metal atoms. Particularly Al and Cu, used in the substrate or the wiring, although aromatic hydroxyl compounds, benzotriazole-based compounds, triazine-based compounds, sulfur-containing compounds, tributylamine, and tripentylamine are preferred.

Examples of suitable benzotriazole-based compounds include benzotriazole-based compounds represented by a general formula (II) shown below.

[Formula 5]

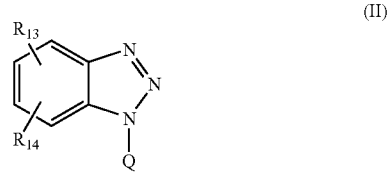

(II)

[wherein, $R_{13}$ and $R_{14}$ each represent, independently, a hydrogen atom, a substituted or unsubstituted hydrocarbon group of 1 to 10 carbon atoms, or a carboxyl group, amino group, hydroxyl group, cyano group, formyl group, sulfonylalkyl group, or sulfo group; and Q represents a hydrogen atom, hydroxyl group, substituted or unsubstituted hydrocarbon group of 1 to 10 carbon atoms (which may contain an amide linkage or ester linkage), an aryl group, or a group represented by a formula (III) shown below:

[Formula 6]

(III)

(wherein in the formula (III), $R_7$ represents an alkylene group of 1 to 6 carbon atoms; and $R_8$ and $R_9$ each represent, independently, a hydrogen atom, hydroxyl group, or a hydroxyalkyl group or alkoxyalkyl group of 1 to 6 carbon atoms)].

A "hydrocarbon group" is an organic group formed from carbon atoms and hydrogen atoms. In the present invention, in the definitions of the groups Q, $R_{13}$, and $R_{14}$, a hydrocarbon group may be either an aromatic hydrocarbon group or an aliphatic hydrocarbon group, may contain either saturated or unsaturated bonds, and have either a straight chain or a branched chain structure. Examples of substituted hydrocarbon groups include hydroxyalkyl groups and alkoxyalkyl groups.

Furthermore, in the case of a substrate formed from Cu, the group Q within the above general formula (II) is preferably a group represented by the above formula (III). Of such groups of the formula (III), those in which $R_8$ and $R_9$ each represent, independently, a hydroxyalkyl group or alkoxyalkyl group of 1 to 6 carbon atoms are particularly preferred. In those cases where at least one of $R_8$ and $R_9$ is an alkyl group of 1 to 6 carbon atoms, the physical properties of the resulting benzotriazole-based compound display poor water solubility, but can still be favorably employed, provided another component capable of dissolving the compound is included within the treatment solution.

In the above general formula (II), a group that yields favorable water solubility is preferably used as the group Q. Specifically, a hydrogen atom, an alkyl group of 1 to 3 carbon atoms (namely, a methyl group, ethyl group, propyl group, or isopropyl group), a hydroxyalkyl group of 1 to 3 carbon atoms, or a hydroxyl group or the like is preferred in terms of anticorrosive properties in those cases where a layer of an inorganic material (such as a polysilicon film or an amorphous silicon film or the like) is present on the surface of the substrate.

Specific examples of suitable benzotriazole-based compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazolecarboxylate, 5-benzotriazolecarboxylic acid, 1-methoxybenzotriazole, 1-(2,2-dihydroxyethyl)-benzotriazole, and 1-(2,3-dihydroxypropyl)-benzotriazole, or alternatively, the compounds 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, and 2,2'-{([(4-methyl-1H-benzotriazol-1-yl)methyl]imino}bispropane, which are commercially available from Ciba Specialty Chemicals Corporation within the Irgamet series. Of these, 1-(2,3-dihydroxypropyl)-benzotriazole, 2,2'-{[(4-methyl-1H-benzotriazol-1-yl)methyl]imino}bisethanol, and 2,2'-{[(5-methyl-1H-benzotriazol-1-yl)methyl]imino}bisethanol are preferred. As the benzotriazole-based compound, either a single compound, or a mixture of two or more different compounds can be used.

Examples of suitable sulfur-containing compounds include dithiodiglycerol [S(CH$_2$CH(OH)CH$_2$ (OH))$_2$], bis(2,3-dihydroxypropylthio)ethylene [CH$_2$CH$_2$(SCH$_2$CH(OH)CH$_2$(OH))$_2$], sodium 3-(2,3-digydroxypropylthio)-2-methyl-propylsulfonate [CH$_2$(OH)CH(OH)CH$_2$SCH$_2$CH(CH$_3$)CH$_2$SO$_3$Na], 1-thioglycerol [HSCH$_2$CH(OH)CH$_2$(OH)], sodium 3-mercapto-1-propanesulfonate [HSCH$_2$CH$_2$CH$_2$SO$_3$Na], 2-mercaptoethanol [HSCH$_2$CH$_2$(OH)], 1,3,5-triazine-2,4,6-trithiol, thioglycolic acid [HSCH$_2$CO$_2$H], and 3-mercapto-1-propanol [HSCH$_2$CH$_2$CH$_2$OH]. Of these, 1-thioglycerol, 1,3,5-triazine-2,4,6-trithiol, and thioglycolic acid are preferred.

The component (c) can use either a single compound, or a combination of two or more different compounds.

The quantity added of the component (c) is preferably within a range from 0.01 to 5 parts by weight, and even more preferably from 0.1 to 1 parts by weight, per 100 parts by weight of the component (a). If the quantity of the component (c) is less than 0.01 parts by weight, then there is a danger that a high precision resist pattern may not be obtained, whereas if the quantity exceeds 5 parts by weight, there is a danger of a deterioration in the adhesion between the resist pattern and the substrate.

In those cases where the chemically amplified photoresist composition is a negative photoresist composition, a cross-linking agent is also included, in addition to the components described above.

There are no particular restrictions on the cross-linking agent used in the present invention, and any of the cross-linking agents typically used in conventional chemically amplified negative photoresist compositions can be used. Suitable examples include melamine resins, urea resins, guanamine resins, glycoluril-formaldehyde resins, succinylamide-formaldehyde resins, or ethylene urea-formaldehyde resins, although alkoxymethylated amino resins such as alkoxymethylated melamine resins or alkoxymethylated urea resins are particularly desirable. These alkoxymethylated amino resins can be produced by reacting a boiling aqueous solution of melamine or urea with formalin to generate a condensation product, and then etherifying this condensation product with a lower alcohol such as methyl alcohol, ethyl alcohol, propyl alcohol, butyl alcohol, or isopropyl alcohol, and then cooling the reaction mixture to precipitate the product. Specific examples of these alkoxymethylated amino resins include methoxymethylated melamine resin, ethoxymethylated melamine resin, propoxymethylated melamine resin, butoxymethylated melamine resin, methoxymethylated urea resin, ethoxymethylated urea resin, propoxymethylated urea resin, and butoxymethylated urea resin. These alkoxymethylated amino resins can be used either alone, or in combinations of two or more different materials. Alkoxymethylated melamine resins are particularly preferred, as they display minimal variation in resist pattern dimensions with variations in the radiation exposure dose, enabling the formation of a stable resist pattern. Of these resins, methoxymethylated melamine resin, ethoxymethylated melamine resin, propoxymethylated melamine resin, and butoxymethylated melamine resin are ideal.

The quantity of the cross-linking agent is preferably within a range from 1 to 30 parts by weight, per 100 parts by weight of the combined weight of the components (a), (b), and (c). If the quantity of the cross-linking agent is less than 1 part by weight, then the plating resistance, chemical resistance, and adhesion of the product coating film tend to deteriorate, and the shape of the formed bumps tend to be inferior, whereas if the quantity exceeds 30 parts by weight, then undesirable developing defects can occur during developing.

Other conventional miscible additives can also be added to a chemically amplified photoresist composition of the present invention according to need, provided such addition does not impair the intrinsic characteristics of the present invention, and examples of such miscible additives include additive resins for improving the properties of the resist film, plasticizers, adhesion assistants, stabilizers, colorants, and surfactants.

In addition, a chemically amplified photoresist composition of the present invention may also include a suitable quantity of an organic solvent for the purposes of regulating the composition viscosity. Specific examples of this organic solvent include ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate, methyl acetate, ethyl acetate, butyl acetate, methyl pyruvate, ethyl pyruvate, methyl methoxypropionate, and ethyl ethoxypropionate. These organic solvents can be used alone, or as a mixed solvent of two or more different solvents.

The quantity used of such solvents, for example in the case in which spin coating is used to form a thick film of at least 20 μm, is preferably sufficient to produce a solid fraction concentration for the chemically amplified photoresist composition that falls within a range from 30 to 65% by weight. If this solid fraction concentration is less than 30% by weight, then producing a thick film that is ideal for the manufacture of a connection terminal becomes problematic, whereas if the solid fraction concentration exceeds 65% by weight, the fluidity of the composition worsens markedly, making handling difficult, and also making it difficult to achieve a uniform resist film using spin coating methods.

Next is a description of an example of a positive chemically amplified photoresist composition.

In the case of a positive chemically amplified photoresist composition, a cross-linking agent is unnecessary. Furthermore, the component (b) and the component (c) are the same as those used for a negative photoresist composition, whereas the component (a) is a resin that displays increased alkali solubility under the action of acid. There are no particular restrictions on the component (a), and any resin that is typically used as the base resin for a positive chemically amplified photoresist can be used. The actual resin can be selected from conventional resins in accordance with the light source used for the exposure. Examples of preferred resins include resins in which an acrylic resin is the principal component, and at least a portion of the hydroxyl groups have been substituted with an alkali dissolution inhibiting group that is dissociable in acid, as well as resins in which a copolymer containing a hydroxystyrene structural unit is the principal component, and at least a portion of the hydroxyl groups have been substituted with an alkali dissolution inhibiting group that is dissociable in acid.

A particularly preferred component (a) comprises at least one resin selected from a group consisting of the same (ii) polymers containing a hydroxystyrene structural unit and (iii) acrylic resins described above for the negative photoresist composition, wherein at least a portion of the hydroxyl groups have been substituted with an alkali dissolution inhibiting group that is dissociable in acid. The reason for this preference is that such resins facilitate better control of the coatability and the developing rate.

Suitable examples of the alkali dissolution inhibiting group that is dissociable in acid include one or more groups selected from tertiary alkyloxy groups such as tert-butyloxy groups and tert-amyloxy groups; cyclic acetaloxy groups such as tetrahydropyranyloxy groups and tetrahydrofuranyloxy groups; straight chain acetaloxy groups such as ethoxyethyloxy groups and methoxypropyloxy groups; cycloalkyloxy groups such as cyclohexyloxy groups and cyclopentyloxy groups; 1-alkyl-cycloalkyloxy groups such as 1-methylcyclohexyloxy groups and 1-ethylcycloalkyloxy groups; and 1-alkyl-polycycloalkyloxy groups such as 1-methyladamantyloxy groups and 1-ethyladamantyloxy groups.

Furthermore, in order to suitably control certain physical and chemical characteristics, other resins may also be added to the component (a). Examples of such resins include the same novolak resins (i) and vinyl resins (iv) described above for the negative photoresist composition.

With the exception of the cross-linking agent and the component (a), as the components (b) and (c), and any other components, the same materials described above for the negative composition can be used.

A chemically amplified photoresist composition of the present invention is ideal for forming a thick-film photoresist layer with a film thickness of at least 20 μm, and preferably from 20 to 150 μm, and even more preferably from 30 to 120 μm, and most preferably from 55 to 75 μm, on top of a support, although the composition is not restricted to such applications. Furthermore, because the photoresist composition comprises a corrosion inhibitor, it is particularly suited to the formation of a photoresist layer on a support that includes copper within at least a portion of the upper surface.

A photoresist laminated product of the present invention comprises a photoresist layer, formed by applying an aforementioned chemically amplified photoresist composition, laminated on the surface of a support.

As the support, conventional materials can be used without any particular restrictions, and suitable examples include substrates for electronic componentry, as well as substrates on which a predetermined wiring pattern has already been formed.

Specific examples of suitable substrates include metal-based substrates such as silicon, silicon nitride, titanium, tantalum, palladium, titanium-tungsten, copper, chrome, iron, and aluminum, as well as glass substrates. Suitable materials for the wiring pattern include copper, solder, chrome, aluminum, nickel, and gold.

Particularly in those cases where copper is used within at least a portion of the upper surface of the support, such as for the substrate or the wiring pattern, then conventionally, the function of the chemically amplified photoresist in those portions where it contacts the copper has been inhibited by the copper, leading to developing defects occurring within those contact portions. By adding a corrosion inhibitor, the present invention enables the manufacture of a stable photoresist laminated product, with a superior developing profile.

Preparation of a chemically amplified photoresist composition according to the present invention may be conducted by simply mixing and stirring together each of the components described above using normal methods, or if necessary, by dispersing and mixing the components using a dispersion device such as a dissolver, a homogenizer, or a three roll mill. Furthermore, following mixing of the components the composition may also be filtered using a mesh or a membrane filter or the like.

A photoresist laminated product of the present invention can be manufactured using the method described below for example. Namely, a solution of a chemically amplified photoresist composition prepared in the manner described above is applied to a substrate, and heating is used to remove the solvent and form the desired coating. The application of the solution to the substrate can be conducted using a method such as spin coating, roll coating, screen printing, or an applicator-based method. The prebake conditions used for a coating of a composition of the present invention vary depending on factors such as the nature of each of the components within the composition, the blend proportions used, and the thickness with which the composition is applied, although typical conditions involve heating at 70 to 130° C., and preferably at 80 to 120° C., for a period of 2 to 60 minutes.

There are no particular restrictions on the film thickness of the photoresist layer, which is preferably at least 20 μm, and even more preferably within a range from 20 to 150 μm, and even more preferably from 30 to 120 μm, and most preferably from 55 to 75 μm.

In order to form a resist pattern using the thus produced photoresist laminated product, in the case of a negative chemically amplified photoresist, the photoresist layer is selectively irradiated (exposed), through a mask with a predetermined pattern, using radiation such as ultraviolet light of wavelength 300 to 500 nm or visible light. As the source for the radiation, a low pressure mercury lamp, high pressure mercury lamp, ultra high pressure mercury lamp, metal halide lamp, or argon gas laser or the like can be used. In this description, "radiation" refers to ultraviolet radiation, visible light, far ultraviolet radiation, X-rays, and electron beams and the like. The radiation exposure dose varies depending on the nature of each of the components within the composition, the blend proportions used, and the thickness of the coating, although in those cases where a ultra high pressure mercury lamp is used, a typical exposure dose is within a range from 100 to 2,000 mJ/cm$^2$.

Subsequently, following exposure, the laminated product is heated using conventional methods, to promote generation and diffusion of the acid, and alter the alkali solubility of the exposed portions of the photoresist layer.

Using a predetermined aqueous alkali solution as the developing solution, the unnecessary portions of the photoresist layer are then dissolved and removed, thus yielding a predetermined resist pattern. Suitable examples of the developing solution include aqueous solutions of alkali materials such as sodium hydroxide and potassium hydroxide. An aqueous solution prepared by adding a water-soluble organic solvent such as methanol or ethanol, or a surfactant to the aqueous solution of any of these alkali compounds may also be used as the developing solution.

The developing time varies depending on the nature of each of the components within the composition, the blend proportions used, and the dried film thickness of the composition, but is typically within a range from 1 to 30 minutes. Furthermore, suitable methods for the developing process include spin methods, dipping methods, puddle methods, and spray developing methods. Following developing, the structure is washed under running water for 30 to 90 seconds, and is then dried using an air gun or an oven or the like.

Connection terminals such as metal posts and bumps can then be formed by using plating or the like to embed a conductor formed from a metal or the like within the resist-free portions (the portions removed by the alkali developing solution) of the thus obtained resist pattern. The size of the resist-free portions in which these connection terminals can be formed preferably include a width of 5 to 200 μm and a depth of 10 to 200 μm. Using a composition of the present invention enables particularly favorable formation of resist patterns with aspect ratios of 2 or greater, and this enables the formation of resist-free patterns with aspect ratios of 2 or greater. Using a composition of the present invention even enables the formation of resist patterns with an aspect ratio of 10, and resist-free patterns based on such resist patterns. The formation of conventional, larger resist-free portions with widths of approximately 25 μm has been possible even without the addition of a corrosion inhibitor as in the present invention, but in the case of resist-free portions with the types of high precision widths and depths described above, conventional methods have been unable to form patterns capable of withstanding practical application. In the present invention, the formation of high precision resist-free portions is achieved by adding a corrosion inhibitor.

There are no particular restrictions on the plating method, and any conventional plating method can be used. As the plating solution, a solder plating solution or copper plating solution can be favorably used.

Finally, the remaining resist pattern is removed in accordance with conventional methods, using a stripping solution or the like.

EXAMPLES

As follows is a description of examples and comparative examples of the present invention, although the present invention is in no way restricted to these examples.

Resin components were synthesized in accordance with the following synthesis examples.

Synthesis Example 1

Synthesis of a Novolak Resin (A-1)

m-cresol and p-cresol were mixed together in a weight ratio of 60:40, formalin was added to the mixture, and a condensation was then conducted under conventional conditions using oxalic acid as a catalyst, thus yielding a cresol novolak resin. This resin was subjected to fractionation to remove the low molecular weight fraction, yielding a novolak resin with a weight average molecular weight of 8,000. This resin was labeled (A-1).

Synthesis Example 2

Synthesis of a Copolymer (A-2) Containing a Hydroxystyrene Structural Unit

A flask equipped with a stirrer, a reflux condenser, a thermometer, and a dropping funnel was flushed with nitrogen, and subsequently charged with propylene glycol methyl ether acetate as a solvent, and stirring of the solvent was then initiated. The temperature of the solvent was then raised to 80° C. The dropping funnel was charged with 2,2'-azobisisobutyronitrile as a polymerization catalyst, together with 75% by weight of hydroxystyrene units and 25% by weight of styrene units as the structural units, and following stirring to dissolve the polymerization catalyst, the resulting solution was added dropwise to the flask at a uniform rate over 3 hours. Reaction was then continued for a further 5 hours at 80° C. to allow the polymerization to proceed. The temperature was then cooled to room temperature, yielding a resin of the component (A).

This resin was subjected to fractionation, yielding a resin (A-2) with a weight average molecular weight of 3,000.

Synthesis Example 3

Synthesis of an Acrylic Resin (A-3)

With the exception of using 130 parts by weight of 2-methoxyethyl acrylate, 50 parts by weight of benzyl methacrylate, and 20 parts by weight of acrylic acid as structural units, reaction was conducted in the same manner as the synthesis example 2, yielding a resin (A-3) with a weight average molecular weight of 20,000.

Synthesis Example 4

Synthesis of an Vinyl Resin (A-4)

A methanol solution of poly(vinyl methyl ether) (weight average molecular weight 50,000) (manufactured by Tokyo Ohka Kogyo Co., Ltd., concentration: 50% by weight) was subjected to a solvent exchange to propylene glycol monomethyl ether acetate using a rotary evaporator, thus yielding a resin (A-4) as a solution with a concentration of 50% by weight.

Synthesis Example 5

Synthesis of a Resin (A-5) that Displays Increased Alkali Solubility Under the Action of Acid With the exceptions of using 50% by weight of adamantyl acrylate, and 50% by weight of 2-ethoxyethyl acrylate as the structural units, reaction was conducted in the same manner as the synthesis example 2, yielding a resin (A-5) with a weight average molecular weight of 250,000.

Examples 1 to 9 and Comparative Example 1

Preparation of Chemically Amplified Photoresist Compositions for Thick Film

The various components shown in Table 1 were mixed together in propylene glycol monomethyl ether acetate to form a series of homogeneous solutions, and each solution was then filtered through a membrane filter with a pore size of 1 µm, thus yielding a chemically amplified positive photoresist composition for thick film. The reference symbols used for the various components shown in Table 1 refer to the following compounds.

(B-1): the compound represented by the chemical formula shown below.

[Formula 8]

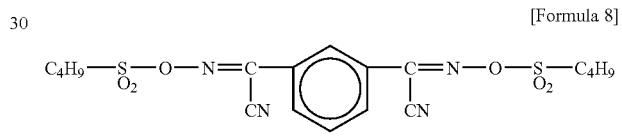

(C-1): 1,3,5-triazine-2,4,6-trithiol (C-2): 1-thioglycerol (C-3): tripentylamine (D-1): cross-linking agent: hexamethoxymethylated melamine (brand name: NIKALAC Mw-100, manufactured by Sanwa Chemical Co., Ltd.)

The thus obtained chemically amplified positive photoresist compositions for thick film were subjected to the following evaluations.

Photosensitivity

Coating films of the various film thickness values were formed on 5-inch silicon wafers, and each coating film was exposed in sections, through a pattern mask used for measuring resolution, at exposure doses ranging from 100 to 10,000 mJ/cm$^2$, using a stepper device (NSR-2005i10D, manufactured by Nikon Corporation). The exposed coating film was then developed in a developing solution (brand name: P-7G from the PMER series, manufactured by Tokyo Ohka Kogyo Co., Ltd.). The developed product was washed under running water, and blown with nitrogen to yield a pattern-wise cured product. This cured product was inspected under a microscope, and the minimum exposure dose required to form a pattern with an aspect ratio of 2 or greater, with no visible residues, in other words, the minimum dose required to form a pattern, was measured.

Developability

Each composition was applied to a 5-inch copper sputtered wafer over a period of 25 seconds, using a spinner operating at 1800 rpm, so as to form a film thickness of approximately 20 μm, and this film was then prebaked on a hotplate at 110° C. for 6-minutes, thus forming a thick-film photoresist laminated product.

Photoresist laminated products comprising a coating film with a thickness of approximately 65 μm were formed in the following manner. Namely, each composition was applied over a period of 25 seconds at 800 rpm, and prebaked on a hotplate at 10° C. for 1 minute, before an additional application for 25 seconds at 800 rpm and subsequent prebaking at 110° C. for 12 minutes, thus forming a thick-film photoresist laminated product.

Furthermore, photoresist laminated products comprising a coating film with a thickness of approximately 120 μm were formed in the following manner. Namely, each composition was first applied over a period of 25 seconds at 800 rpm and prebaked on a hotplate at 110° C. for 1 minute, then once again applied for 25 seconds at 500 rpm and prebaked on a hotplate at 110° C. for 1 minute, before a final application for 25 seconds at 500 rpm and subsequent prebaking at 110° C. for 20 minutes, thus forming a thick-film photoresist laminated product.

Each of the thus formed thick-film photoresist laminated products was exposed with ultraviolet radiation through a pattern mask used for measuring resolution, at exposure doses ranging in a stepwise manner from 100 to 10,000 mJ/cm$^2$, using a stepper device (NSR-2005i10D, manufactured by Nikon Corporation). Following exposure, the product was heated at 70° C. for 5 minutes, and was then developed in a developing solution (brand name: P-7G from the PMER series, manufactured by Tokyo Ohka Kogyo Co., Ltd.).

The developed product was washed under running water, and blown with nitrogen to yield a pattern-wise cured product. This cured product was inspected under a microscope, and the developability and resolution were evaluated using the following criteria.

A: A pattern with an aspect ratio of 2 or greater was generated at one of the above exposure doses, and no residues were visible.

C: Either a pattern with an aspect ratio of 2 or greater was not generated, or residues were visible.

The aspect ratio represents the value of (the height of the patterned resist divided by the width of the patterned resist).

Resist Shape

The substrates comprising a pattern-wise cured product prepared for the evaluation of developability and resolution were used as test specimens. The state of the pattern-wise cured product formed on the surface of each substrate was inspected, and the shape of the pattern-wise cured product was evaluated using the following criteria.

A: A rectangular resist pattern was obtained.

B: A rectangular resist pattern with a slight inverted taper shape was obtained.

C: A rectangular resist pattern was not obtained.

Shielding Ability

Pattern-wise cured products were formed on copper sputtered wafers using the same method as that described for the evaluation of developability and resolution, and the shape of each resist pattern was inspected visually, and evaluated using the following criteria.

A: A resist pattern was formed.

C: Residual film remained.

Each of the above evaluations was performed for each photoresist composition prepared in the examples 1 to 9, and the comparative example 1. The results are shown in Table 2. In the example 3, the film thickness was varied, and the composition evaluated at each thickness.

TABLE 1

(Units: parts by weight)

| | Example | | | | | | | | | Comparative |
|---|---|---|---|---|---|---|---|---|---|---|
| | 1 | 2 | 3 | 4 | 5 | 6 | 7 | 8 | 9 | example 1 |
| A-1 | 90 | 70 | 70 | 70 | 70 | 70 | | 60 | | 70 |
| A-2 | | 20 | 20 | 20 | 20 | 20 | 90 | 10 | | 20 |
| A-3 | | | | | | | | 10 | | |
| A-4 | | | | | | | | 10 | | |
| A-5 | | | | | | | | | 100 | |
| B-1 | 0.5 | 0.5 | 0.5 | 0.5 | 0.5 | 0.5 | 0.5 | 0.5 | 0.5 | 0.5 |
| C-1 | 0.3 | 0.1 | 0.3 | 1 | | | 0.3 | 0.3 | 0.3 | |
| C-2 | | | | | 0.3 | | | | | |
| C-3 | | | | | | 0.3 | | | | |
| D-1 | 10 | 10 | 10 | 10 | 10 | 10 | 10 | 10 | | 10 |

TABLE 2

| | Example | | | | | | | | | | | Comparative |
|---|---|---|---|---|---|---|---|---|---|---|---|---|
| | 1 | 2 | 3 | 3 | 3 | 4 | 5 | 6 | 7 | 8 | 9 | example 1 |
| Film thickness | 65 | 65 | 20 | 65 | 120 | 65 | 65 | 65 | 65 | 65 | 65 | 65 |
| Photosensitivity (mJ/cm$^2$) | 1000 | 1000 | 500 | 1000 | 1500 | 1000 | 1000 | 1000 | 1000 | 1000 | 3000 | — |
| Developability | A | A | A | A | A | A | A | A | A | A | A | — |
| Resist shape | A | A | A | A | B | A | A | A | A | A | A | — |
| Shielding ability | A | A | A | A | A | A | A | A | A | A | A | C |

From the results shown in Table 2 it is evident that the examples according to the present invention displayed favorable results for all the evaluations.

INDUSTRIAL APPLICABILITY

As described above in detail, according to the present invention, a stable chemically amplified photoresist composition that undergoes no change in alkali solubility prior to irradiation, and a photoresist laminated product produced by laminating the photoresist composition onto a support can be obtained, and a manufacturing method for a photoresist pattern and a manufacturing method for a connection terminal that use the photoresist composition and the laminated product can also be provided. Accordingly, the present invention is extremely useful from an industrial viewpoint.

The invention claimed is:

1. A photoresist laminated product comprising a support, including copper within at least a portion of the upper surface of the support laminated on the surface of the support, and a photoresist layer consisting of a positive photoresist composition including (a) a resin that undergoes a change in alkali solubility under the action of acid, (b) a compound that generates acid upon irradiation, and (c) a corrosion inhibitor, wherein said corrosion inhibitor (c) is represented by a general formula (IV);

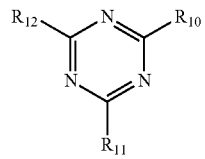

[wherein, $R_{10}$ represents a hydrogen atom or a mercapto group, $R_{11}$ and $R_{12}$ each independently represent, a halogen atom, a hydrogen atom, a hydroxyl group, an amino group, a mercapto group, a substituted or unsubstituted hydrocarbon of 1 to 10 carbon atoms, a substituted or unsubstituted alkyloxy group of 1 to 10 carbon atoms, or a hydrocarbon-substituted amino group of 1 to 10 carbon atoms], wherein the proportion of the corrosion inhibitor (c) is within a range from 0.01 to 5 parts by weight, per 100 parts by weight of the resin (a).

2. The photoresist laminated product according to claim 1, wherein the photoresist layer is a thick-film photoresist layer with a film thickness of 20 to 150 μm.

3. The photoresist laminated product according to claim 1, wherein the corrosion inhibitor (c) is 1,3,5-triazine-2,4,6-trithiol.

4. The photoresist laminated product according to claim 3, wherein the photoresist layer is a thick film photoresist layer having a thickness of from 20 to 150 μm.

5. A manufacturing method for a photoresist pattern comprising an exposure step of selectively irradiating said photoresist laminated product according to any one of claims 1 through 4 with radiation, and a developing step of developing said laminated product following exposure to produce a photoresist pattern.

6. A manufacturing method for a connection terminal comprising manufacturing a photoresist pattern according to the method of claim 5 and forming a connection terminal from a conductor inside a resist-free portion of the photoresist pattern.

7. The manufacturing method of claim 6, wherein an aspect ratio of said resist portion is at least 2.

* * * * *

UNITED STATES PATENT AND TRADEMARK OFFICE
CERTIFICATE OF CORRECTION

| | | |
|---|---|---|
| PATENT NO. | : 7,879,525 B2 | Page 1 of 1 |
| APPLICATION NO. | : 10/547830 | |
| DATED | : February 1, 2011 | |
| INVENTOR(S) | : Yasushi Washio and Koji Saito | |

It is certified that error appears in the above-identified patent and that said Letters Patent is hereby corrected as shown below:

Column 7, Line 15 (approx.), After ")" insert --.--.

Column 8, Line 32 (approx.), Change "bis(1,1-dimethylethlsulfonyl)diazomethane," to --bis(1,1-dimethylethylsulfonyl)diazomethane,--.

Column 10, Line 25, Change "{([(" to --{[(--.

Column 10, Line 38, Change "digydroxypropylthio" to --dihydroxypropylthio--.

Column 13, Line 31 (approx.), Change "components" to --components,--.

Column 17, Line 8, Change "10°" to --110°--.

Column 20, Line 33 (approx.), In Claim 7, change "resist" to --resist-free--.

Signed and Sealed this
Ninth Day of August, 2011

David J. Kappos
*Director of the United States Patent and Trademark Office*